(12) United States Patent
Abelé et al.

(10) Patent No.: US 8,159,109 B2
(45) Date of Patent: Apr. 17, 2012

(54) MICRORESONATOR

(75) Inventors: Nicolas Abelé, Paris (FR); Pascal Ancey, Revel (FR); Alexandre Talbot, Grenoble (FR); Karim Segueni, Saint Sauveur (FR); Guillaume Bouche, Grenoble (FR); Thomas Skotnicki, Crolles-Monfort (FR); Stéphane Monfray, Grenoble (FR); Fabrice Casset, Tencin (FR)

(73) Assignees: STMicroelectronics (Crolles 2) SAS, Crolles (FR); STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/850,126

(22) Filed: Aug. 4, 2010

(65) Prior Publication Data

US 2010/0295416 A1 Nov. 25, 2010

Related U.S. Application Data

(60) Division of application No. 12/266,471, filed on Nov. 6, 2008, now Pat. No. 7,858,407, which is a continuation of application No. 11/883,245, filed as application No. PCT/FR2006/050078 on Jan. 13, 2006, now abandoned.

(30) Foreign Application Priority Data

Jan. 31, 2005 (FR) ..................................... 05 50276

(51) Int. Cl.
H01L 21/00 (2006.01)

(52) U.S. Cl. .......................................... 310/309; 438/45
(58) Field of Classification Search ................... 310/309; 438/22, 42, 45, 51
See application file for complete search history.

(56) References Cited

U.S. PATENT DOCUMENTS

| | | | |
|---|---|---|---|
| 6,448,622 B1 | 9/2002 | Franke et al. | |
| 6,856,217 B1 | 2/2005 | Clark et al. | |
| 6,965,128 B2 * | 11/2005 | Holm et al. | 257/103 |
| 7,205,867 B2 * | 4/2007 | Lutz et al. | 333/186 |
| 7,625,772 B2 | 12/2009 | Casset et al. | |
| 7,667,200 B1 * | 2/2010 | Watts et al. | 250/338.1 |
| 7,791,432 B2 * | 9/2010 | Piazza et al. | 333/186 |
| 7,800,279 B2 * | 9/2010 | Yang | 310/307 |
| 2002/0189350 A1 * | 12/2002 | Tu | 73/504.04 |
| 2003/0173611 A1 | 9/2003 | Bertz et al. | |
| 2003/0190776 A1 * | 10/2003 | Wong et al. | 438/200 |
| 2004/0209435 A1 | 10/2004 | Partridge et al. | |
| 2006/0071578 A1 * | 4/2006 | Drabe et al. | 310/309 |
| 2007/0046398 A1 * | 3/2007 | Nguyen et al. | 333/186 |
| 2008/0150647 A1 | 6/2008 | Yang et al. | |
| 2009/0115283 A1 * | 5/2009 | Tripard et al. | 310/300 |
| 2009/0152998 A1 * | 6/2009 | Abele et al. | 310/365 |

FOREIGN PATENT DOCUMENTS

JP 04-364380 A 12/1992

(Continued)

OTHER PUBLICATIONS

International Search Report from corresponding International Application No. PCT/FR2006/050078 filed Jan. 31, 2006.
Buschnakowski et al.: "Development and Characterisation of a High Aspect Ratio Vertical FET Sensor for Motion Detection", Transducers 2003, 12th International Conference on Solid-State Sensors, Actuators and Microsystems, vol. 2, Jun. 9, 2003, pp. 1391-1394, XPOI0647614.

*Primary Examiner* — Thomas Dougherty
(74) *Attorney, Agent, or Firm* — Wolf, Greenfield & Sacks, P.C.

(57) ABSTRACT

A microresonator comprising a single-crystal silicon resonant element and at least one activation electrode placed close to the resonant element, in which the resonant element is placed in an opening of a semiconductor layer covering a substrate, the activation electrode being formed in the semiconductor layer and being level at the opening.

15 Claims, 6 Drawing Sheets

FOREIGN PATENT DOCUMENTS

| | | |
|---|---|---|
| WO | WO 02/17482 A2 | 2/2002 |
| WO | WO 2004/027796 A2 | 4/2004 |

* cited by examiner

MICRORESONATOR

CROSS REFERENCE TO RELATED APPLICATIONS

This application is a divisional of prior application Ser. No. 12/266,471, filed Nov. 6, 2008, entitled "Microresonator", which is a continuation of prior application Ser. No. 11/888,245, filed Jul. 27, 2007 entitled "Microresonator" which application is a U.S. National Stage filing of International application Serial No. PCT/FR2006/050078, filed on Jan. 31, 2006, entitled "Microresonator" which application claims the priority benefit of French patent application number 05/50276, filed on Jan. 31, 2005, which applications are hereby incorporated by reference to the maximum extent allowable by law.

BACKGROUND OF THE INVENTION

1. Field of the Invention

The present invention relates to a microresonator.

2. Discussion of the Related Art

FIG. 1 is a perspective view of a known microresonator. This microresonator is described in patent WO-02/17482 entitled "Micromechanical resonator device and micromechanical device utilizing same". This microresonator is formed above a substrate 1. It comprises a "mushroom"-shaped resonant element 2 formed of a cylindrical head resting on a foot attached to the substrate. Two metal pads 3 and 4 are placed on each side of resonant element 2. The vertical wall of each of pads 3 and 4 located opposite to the wall of the cylindrical head is curved and surrounds the cylindrical head. The distance between resonant element 2 and pads 3 and 4 is very short, on the order of from a few tens of nanometers to one micrometer.

When an A.C. voltage is applied between resonant element 2 and pads 3 and 4, resonant element 2 tends to deform by expanding or retracting. When resonant element 2 starts resonating, the resonant element expands and retracts at the resonance frequency. Pads 3 and 4 and resonant element 2 are then equivalent to a capacitor having its capacitance varying at the resonance frequency.

The previously-described microresonator can be used in various fashions. An example of use as a filter is described hereafter. As shown in FIG. 1, resonant element 2 is connected to a bias voltage Vpol via a coil L and connected to a resonance detection circuit via a capacitor C. The detection circuit is represented by a charge resistor Rc placed between capacitor C and the ground. Pads 3 and 4 receive an input voltage ye. When voltage ve comprises a D.C. component and an A.C. component varying at the resonance frequency, a current is varying at the resonance frequency is provided to the detection circuit. When voltage ve varies at a frequency different from the resonance frequency, the variation of current is provided to the detection circuit is substantially zero.

A method for manufacturing the microresonator shown in FIG. 1 is described in the above-mentioned patent. This method is complex and comprises a great number of steps. The four big phases of this method are the following.

In a first phase, illustrated in FIG. 2A, a hollow insulating portion 11 formed for example of silicon oxide is formed on a substrate 10.

In a second phase, illustrated in FIG. 2B, a silicon element 12 having the shape of a mushroom comprising a foot placed in the hole of insulating portion 11 and a cylindrical head resting on insulating portion 11 is formed.

In a third phase, illustrated in FIG. 2C, a thin silicon oxide layer 13 is formed around resonant element 12 and on the free portions of insulating portion 11. Conductive pads 14 and 15 are then formed on substrate 10 on each side of element 12. The conductive pads are in contact with silicon oxide layer 13.

In a fourth phase, illustrated in FIG. 2D, silicon oxide layer 13 and insulating portion 11 are eliminated. A resonator such as illustrated in FIG. 1 is then obtained.

Apart from its complexity, the previously-described method has the disadvantage of forming a resonant element having a polycrystalline structure. Indeed, resonant element 12 is obtained by silicon deposition on a silicon oxide layer, which results in forming polysilicon. The polycrystalline structure of the resonant element is a disadvantage since this causes mechanical weaknesses. Further, the resonance frequency of a polysilicon resonant element may vary from one resonant element to another.

SUMMARY OF THE INVENTION

An object of the present invention is to provide a simple method for manufacturing a microresonator.

Another object of the present invention is to provide a microresonator structure, the resonant element of which has a good mechanical hold.

Another object of the present invention is to provide such a microresonator, the resonant element of which has a resonance frequency substantially constant from one resonator to another.

Another object of the present invention is to provide such a microresonator, the lateral motions of which are accurately detected.

To achieve these and other objects, the present invention provides a microresonator comprising a resonant element and at least one activation electrode placed close to the resonant element, in which the resonant element is placed in an opening of a semiconductor layer covering a substrate, the activation electrode being formed in the semiconductor layer and being level at the opening, wherein the resonant element is made of single-crystal silicon.

According to an embodiment of the present invention, the resonant element has the shape of a mushroom having its foot attached to the substrate.

According to an embodiment of the present invention, the microresonator further comprises a vertical detection transistor comprising a stacking of three doped semiconductor areas formed in the semiconductor layer and which is level at the opening, the lower and upper doped semiconductor areas forming source and drain areas of a first doping type, the intermediary semiconductor area forming a "substrate" area of a second doping type, the resonant element forming the transistor gate.

The present invention also provides a method for forming a microresonator comprising the steps of forming a sacrificial portion above a substrate; forming a first semiconductor layer above the previously-obtained structure; forming in the semiconductor layer at least one electrode area placed against or above a peripheral portion of the sacrificial portion; forming an opening in the first semiconductor layer above the first sacrificial portion, whereby said at least one electrode areas is level at the opening; forming a sacrificial layer covering the bottom, the wall, and the edges of the opening; forming a hole in the sacrificial layer at the bottom of the opening; forming a second semiconductor layer on the previously-obtained structure; etching the second semiconductor layer to keep a portion forming a resonant element placed in the openings and slightly extending over the edges of the opening; and removing the sacrificial portion and layer, and in which the sacrificial portion and layer are formed of a material such as silicon-germanium which is selectively etchable with respect to the substrate, to the first semiconductor layer and to the resonant element, and which is such that it enables forming a second single-crystal semiconductor layer at least in said opening.

According to an embodiment of the present invention, the method further comprises, after the forming of the sacrificial silicon-germanium portion, the forming of an insulating portion above the sacrificial portion, the insulating portion being used as an etch stop layer on forming of the opening by etching of the first semiconductor layer.

According to an embodiment of the present invention, the first and second semiconductor layers are silicon layers obtained by epitaxial growth, the resonant element being made of single-crystal silicon.

According to an embodiment of the present invention, the sacrificial layer has a thickness of a few tens of nanometers.

According to an embodiment of the present invention, the method is intended to form a microresonator comprising a vertical detection transistor, and comprises prior to the forming of the opening a step of performing three successive implantations from a same lithography mask shifted to form three stepped doped areas, the lower doped area being placed against or above the sacrificial portion and the upper doped region being placed at the surface of the first semiconductor layer, the doped areas being possibly partially etched in the forming of the opening in the first semiconductor layer, whereby the three doped areas are level with the opening.

According to an embodiment of the present invention, the insulating portion does not cover the entire sacrificial portion, the three doped areas being formed above an exposed area of the sacrificial portion.

The foregoing objects, features, and advantages of the present invention will be discussed in detail in the following non-limiting description of specific embodiments in connection with the accompanying drawings.

DETAILED DESCRIPTION

Figure 1:
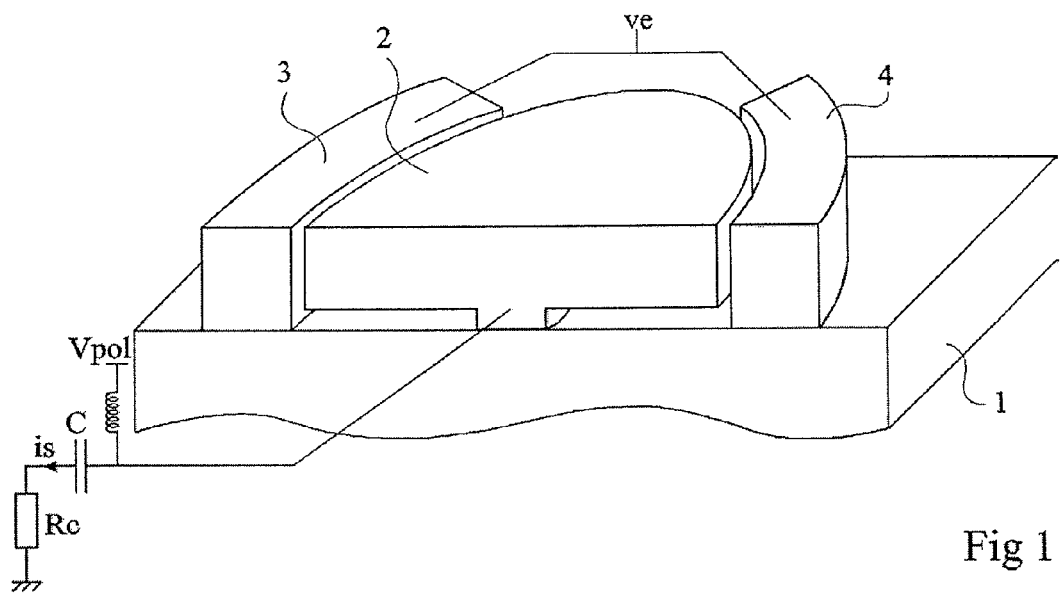
FIG. 1 is a perspective view of a known microresonator.
Figure 2A:
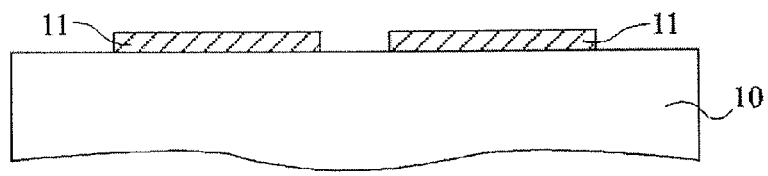
FIGS. 2A to 2D are cross-section views, previously described, of structures obtained after successive steps of a method for forming the microresonator of FIG. 1.
Figure 2B:
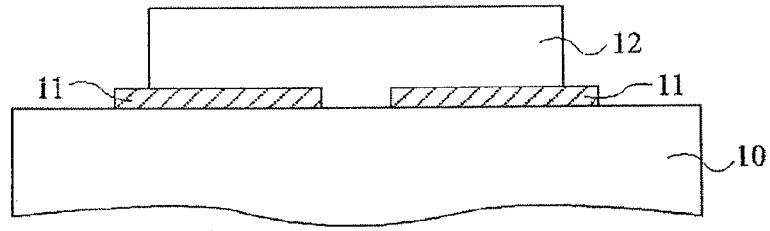
Figure 2C:
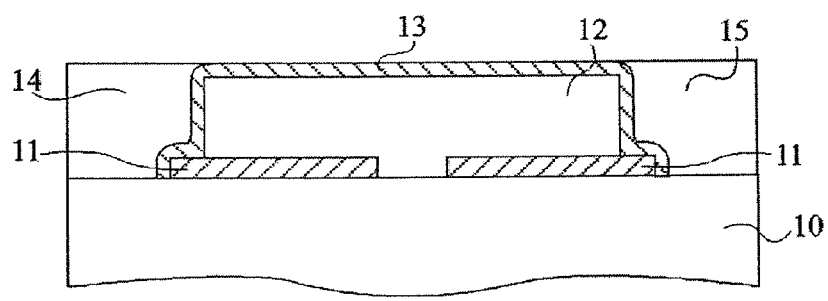
Figure 2D:
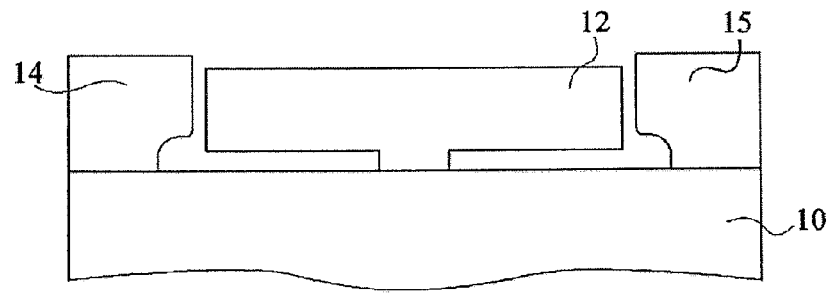

For clarity, the same elements have been designated with the same reference numerals in the different drawings and, further, as usual in the representation of integrated circuits, the various drawings are not to scale.

The method of the present invention is described hereafter in relation with FIGS. 3A to 3H.

Figure 3A:
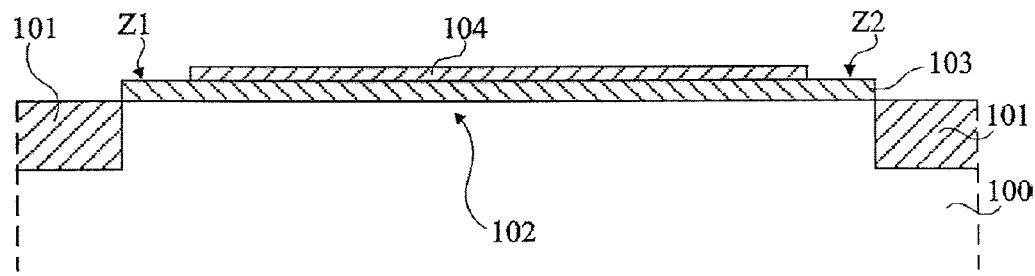
FIGS. 3A to 3H are cross-section views of structures obtained after successive steps of a method for manufacturing a microresonator according to the present invention.

In an initial step, illustrated in FIG. 3A, an insulating layer 101 surrounding an upper portion 102 of substrate 100 is formed in the surface of a substrate 100. Substrate 100 for example is single-crystal silicon and insulating area 101 is a trench filled with silicon oxide.

A silicon-germanium portion 103 is then grown by selective epitaxy above substrate portion 102. This epitaxial growth is conventionally performed according to a vapor phase deposition performed from a mixture of dichlorosilane and germane. The deposition method is selective to avoid growing silicon-germanium above insulating area 101.

An insulating layer portion 104 is then formed on silicon-germanium portion 103. Insulating portion 104 is smaller than silicon-germanium portion 103 to expose one or several peripheral areas of silicon-germanium portion 103. In this example, two exposed areas Z1 and Z2 are located respectively to the left and to the right of silicon-germanium portion 103. Insulating portion 104 can be obtained in several ways. A deposition of an insulating layer may be performed on the previously-obtained structure, after which this insulating layer may be etched by keeping a portion above a part of silicon-germanium portion 103. A thermal oxidation of silicon-germanium portion 103 may also be performed, after which the silicon oxide layer thus formed may be etched to expose certain parts of silicon-germanium portion 103.

Figure 3B:
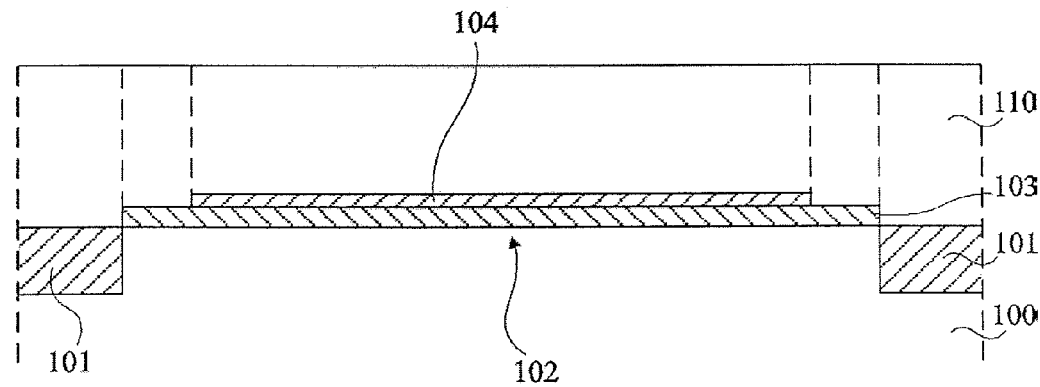

At the next step, illustrated in FIG. 3B, a layer 110 made of silicon or possibly of another semiconductor material is grown by non-selective epitaxy above the previously-obtained structure. It should be noted that the silicon portions placed above insulating area 101 and insulating portion 104 are polycrystalline while the silicon portions placed above exposed areas Z1 and Z2 are single-crystal portions. Further, silicon layer 110 may be slightly doped in its epitaxial growth. In the following description, it will be considered that silicon layer 110 contains P-type dopant elements.

Figure 3C:
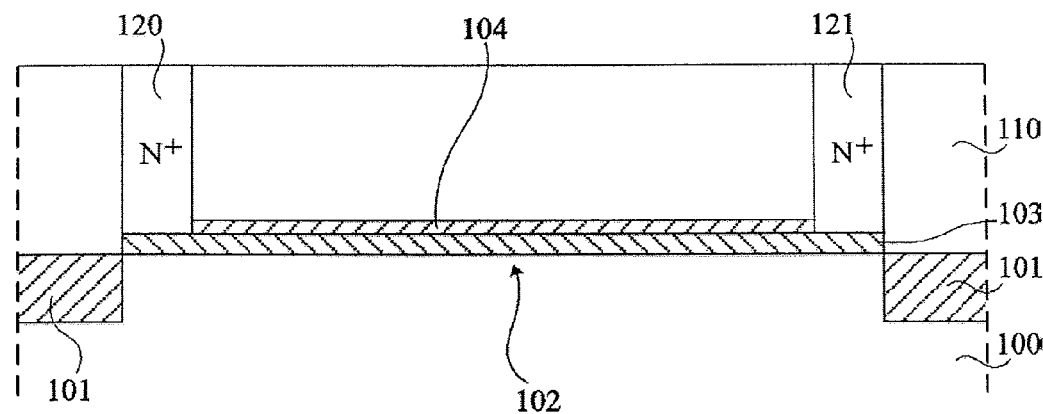

At the next step, illustrated in FIG. 3C, an ion implantation is performed to form at least one electrode area in silicon layer 110 above a peripheral portion of silicon-germanium portion 103 or possibly against silicon-germanium portion 103. In this example, two heavily-doped N-type electrode areas 120 and 121 are formed above exposed areas Z1 and Z2 of silicon-germanium portion 103.

Figure 3D:
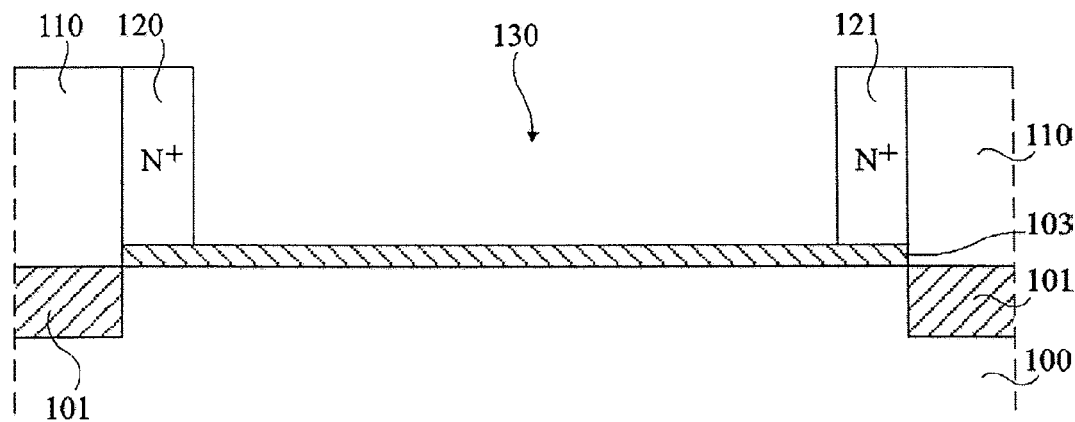

At the next step, illustrated in FIG. 3D, an opening 130 is formed by etching in silicon layer 110 above insulating portion 104.

In this example, opening 130 is formed between electrode areas 120 and 121 so that they are level with opening 130. The used etch method is preferably anisotropic so that the opening wall is vertical. Insulating portion 104 is then eliminated, and thus does not appear in FIG. 3D.

It should be noted that in the previously-described method, insulating portion 104 is used as a stop layer in the etching of silicon layer 110. The step of forming an insulating portion on silicon-germanium portion 103 prior to the forming of silicon layer 110 may be avoided since there exist etch methods enabling etching silicon selectively with respect to silicon-germanium. In this case, silicon-germanium portion 103 would be used as a stop layer in the etching of silicon layer 110 to form opening 130. However, the use of an insulating portion as a stop layer enables better controlling the depth of opening 130, which enables more accurately defining the thickness of the resonant element of the microresonator, as will appear hereafter.

Figure 3E:
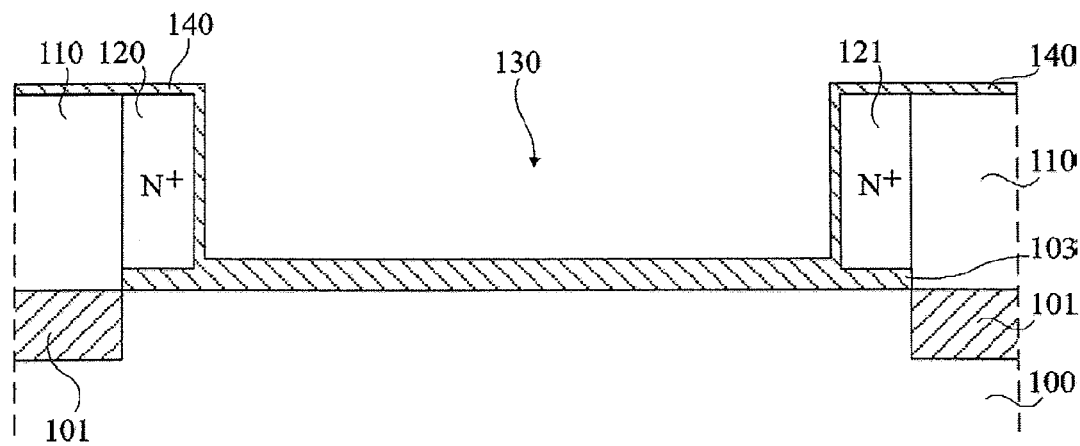

At the next step, illustrated in FIG. 3E, a thin silicon-germanium layer 140 is grown by epitaxy to cover the walls and the bottom of opening 130 as well as silicon layer 110. It should be noted that silicon-germanium layer 140 is single-crystal in and on the edges of opening 130.

Figure 3F:
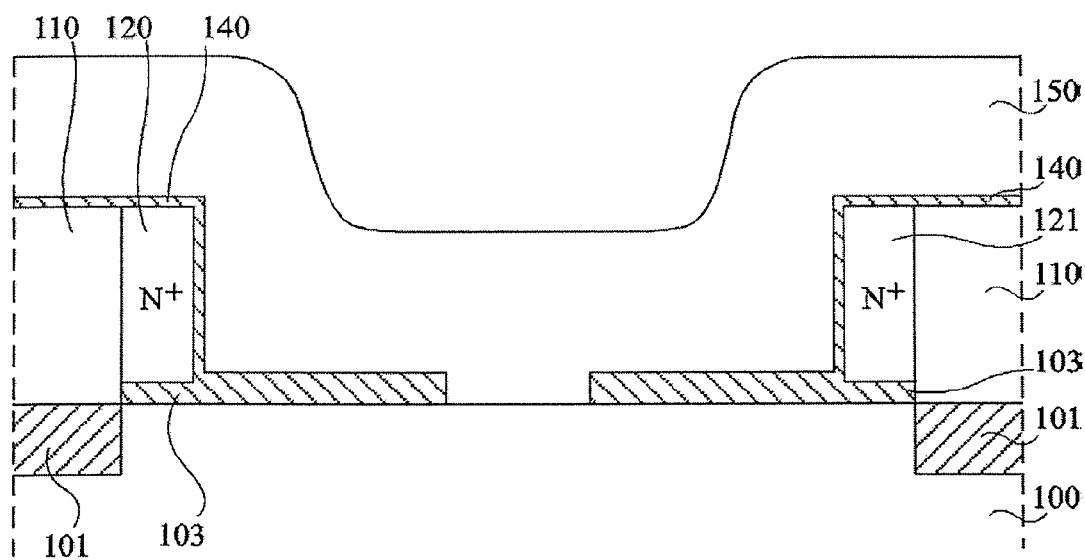

At the next step, illustrated in FIG. 3F, a hole crossing silicon-germanium portion 103 and layer 140 is formed substantially in the middle of opening 130. A silicon layer 150 is then grown by non-selective epitaxy above silicon-germanium layer 140. This silicon layer will be single-crystal at least above locations where the underlying silicon-germanium layer is single-crystal.

Figure 3G:
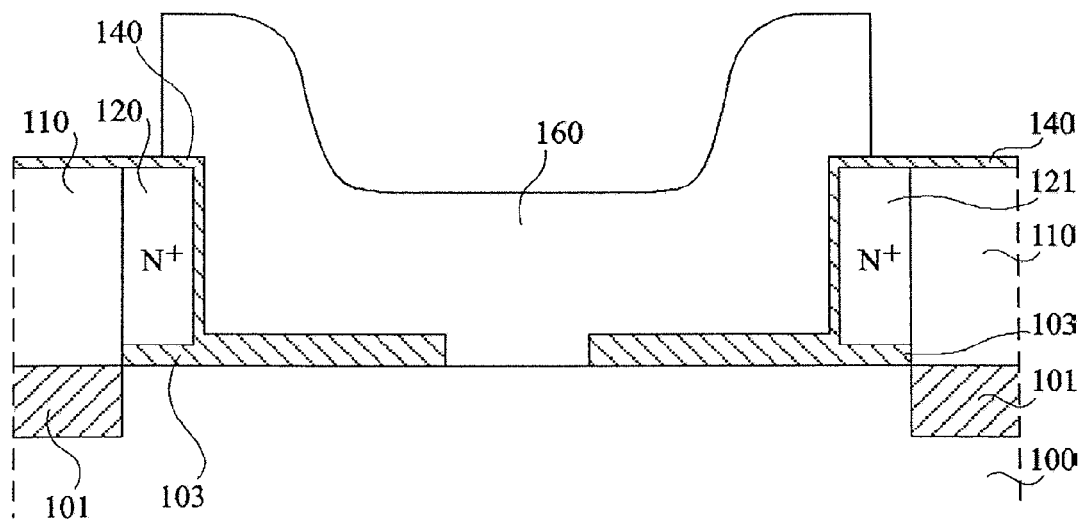

At the next step, illustrated in FIG. 3G, silicon layer 150 is etched to keep silicon in opening 130. In practice, a small portion of silicon will be kept on the edges of opening 130 to avoid etching the silicon placed against the walls of opening 130. The remaining silicon portion forms a resonant element 160.

Figure 3H:
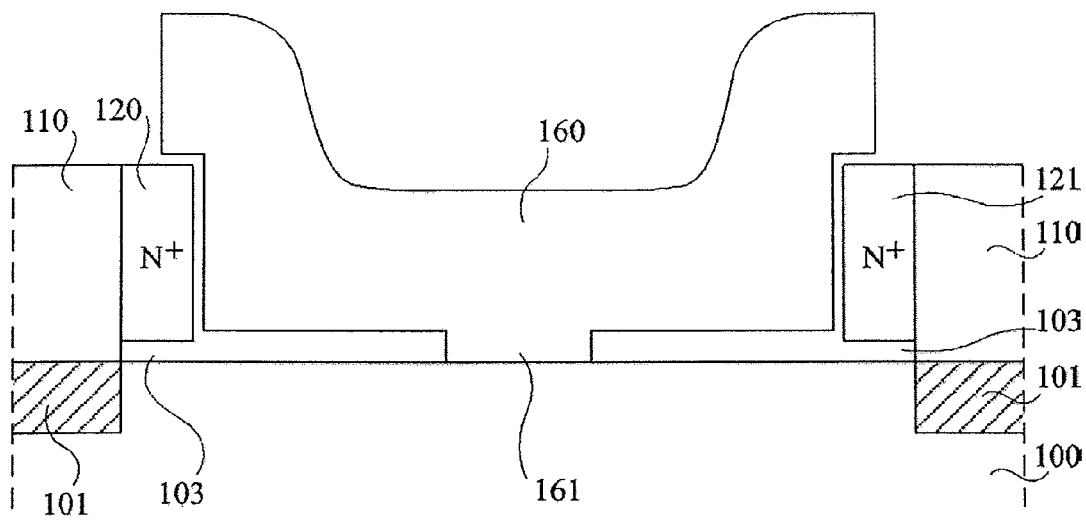

At the next step, illustrated in FIG. 3H, silicon-germanium layer 140 and the silicon-germanium portion 103 initially deposited on substrate 100 are eliminated. The used etch method must be selective so that resonant element 160, the remaining portions of silicon layer 110, and substrate 100 are not etched. A resonant element 160 resting on substrate 100 on a foot 161 is thus obtained.

Figure 4A:
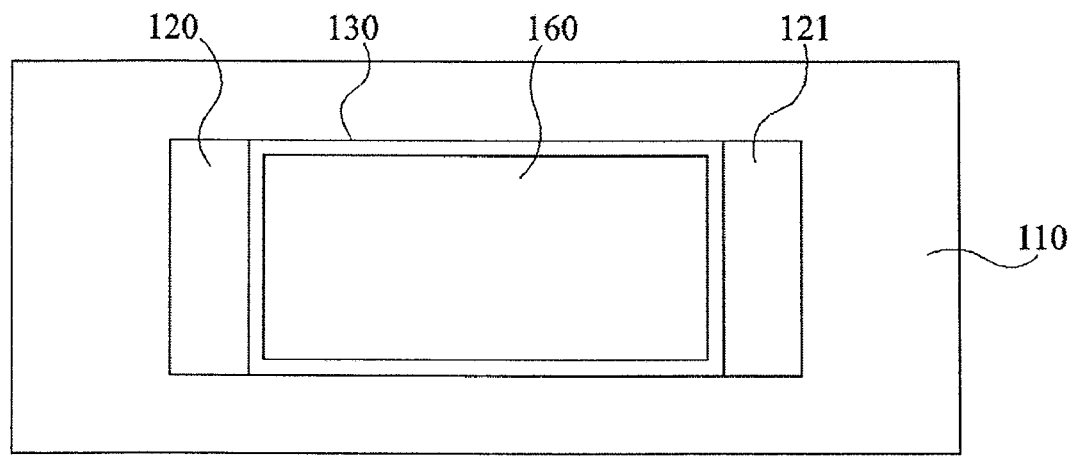
FIGS. 4A and 4B are examples of top views of a cross-section of the structure obtained at the end of the last step illustrated in FIG. 3H.
Figure 4B:
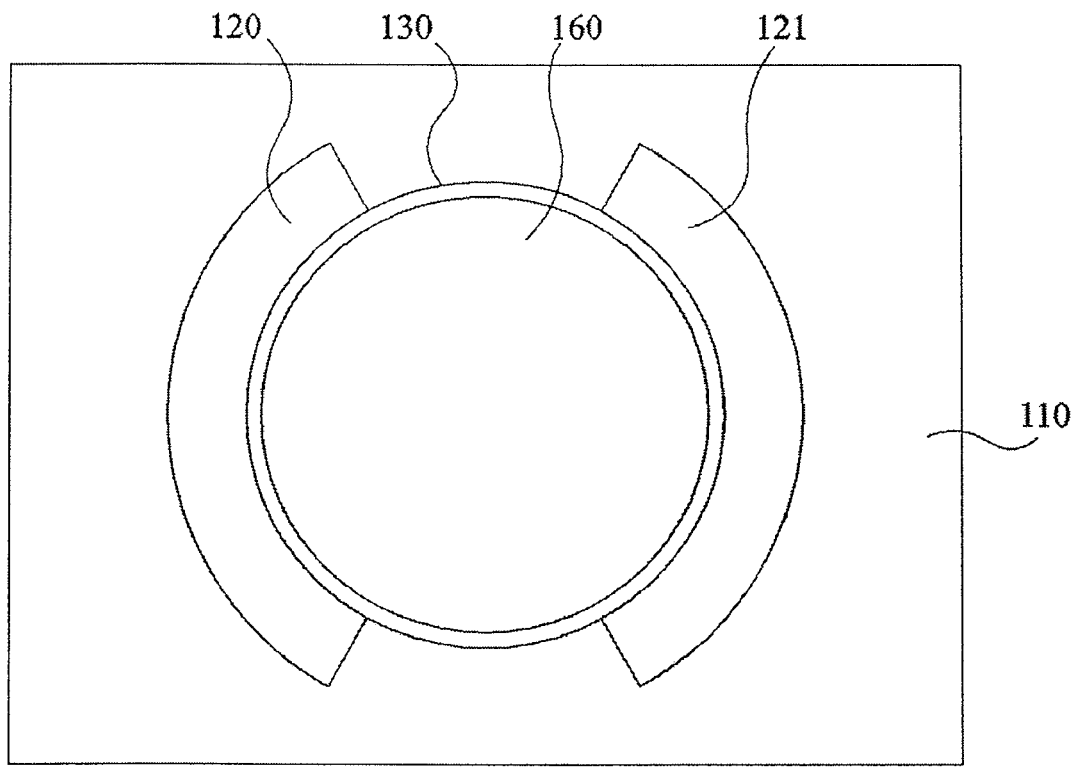

FIGS. 4A and 4B are "horizontal" cross-section views performed along a plane parallel to the surface of substrate 100 placed inside of opening 130.

In the example illustrated in FIG. 4A, opening 130 and the resonant element 160 placed inside of this opening have a substantially rectangular shape. Electrode areas 120 and 121 have a substantially rectangular shape and are placed against two opposite walls of opening 130.

In the example shown in FIG. 4B, opening 130 and resonant element 160 have a substantially circular shape. Electrode areas 120 and 121 are curved and are placed opposite to each other against the wall of opening 130.

In the previously-described method, silicon-germanium portion 103 and layer 140 are sacrificial layers. A material other than silicon-germanium may be used. The selected material must be selective etchable with respect to substrate 100, to silicon layer 110, and to resonant element 160, and must enable depositing or growing by epitaxy a semiconductor layer exhibiting a single-crystal structure.

An advantage of the method of the present invention is that it enables forming a semiconductor resonant element exhibiting a single-crystal structure.

Further, to form the sacrificial portion and layer, a material enabling obtaining a very thin layer will preferably be used to finally have a small interval between resonant element 160 and electrode areas 120 and 121. It is possible to obtain an interval of a few tens of nanometers with a silicon-germanium layer. This feature is important since the motions of this type of resonant element are of a few angstroms. The detection of such small motions requires having a very small distance between the resonant element and the electrode areas to induce a significant capacitance variation.

The resonance frequency of such a microresonator may reach several GHz, the frequency depending on the biasing conditions of the resonant element.

A microresonator according to the present invention comprises a resonant element placed in an opening of a semiconductor layer covering a substrate. In the case where the semiconductor layer and the "support" substrate are formed of a same material, it can be considered that the layer and the substrate form a single substrate, the resonant element being then placed in a cavity of this substrate. Further, the resonant element is attached to the substrate by one or several "feet". The microresonator further comprises one or several electrode areas placed against the walls of the opening in which the resonant element is placed. The portion of the resonant element placed in the opening has a shape substantially identical thereto so that the distance between the resonant element and the opening wall is relatively small in front of the electrode areas.

According to an aspect of the present invention, the resonant element is formed of a semiconductor material exhibiting a single-crystal structure.

In the case where the previously-described microresonator is an element of an integrated circuit, transistor-type components may be formed at the surface of silicon layer 110. A "bubble" may be placed above the microresonator, after which one or several metal connection levels may be formed above semiconductor layer 110 and the bubble. A metal contact may be placed above each electrode area 120 and 121 to connect them to other components of the circuit via a metal line. Further, to have access to resonant element 160, a doped layer buried in substrate 100 may be formed. This buried doped layer, for example, of type N if the substrate is of type P, then connects the foot of the resonant element to an area of silicon layer 110 by running under insulating area 101. This buried doped layer may be connected to a metal connection line via a doped area formed in silicon layer 110.

A microresonator according to the present invention may be used in various circuits, for example, as a filter. It may be used similarly to what has been described for the microresonator illustrated in FIG. 1.

According to an alternative embodiment of a microresonator according to the present invention, the detection of the motions of the resonant element is performed by means of a vertical transistor having the resonant element as a gate. The source, drain, and channel areas of this transistor are placed in the substrate against the wall of the opening in which the resonant element is placed. The forming of such a microresonator comprises of adding to the previously-described method a vertical transistor forming step.

Figure 5A:
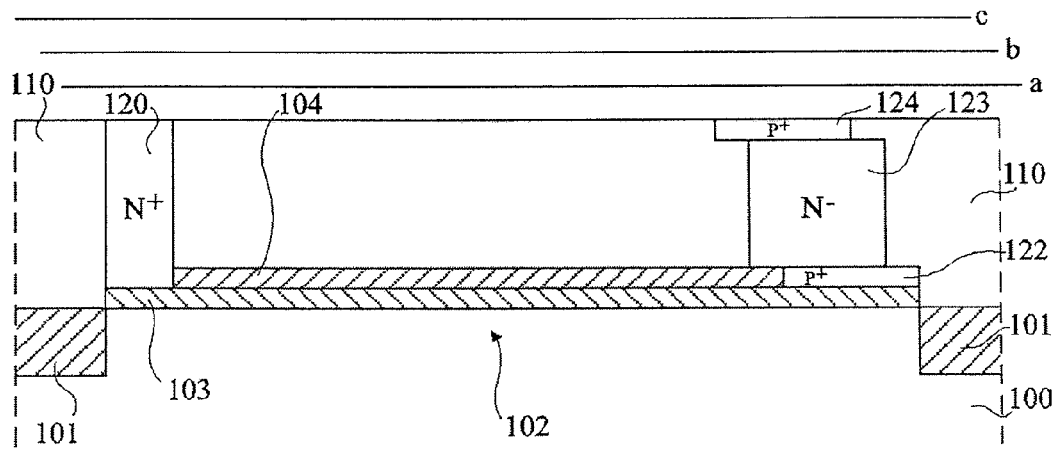
FIGS. 5A to 5C are cross-section views of structures obtained at the end of successive steps of a method for manufacturing a microresonator according to a variation of the method of the present invention.

As illustrated in FIG. 5A, after the forming of silicon layer 110 (see FIG. 3B), three successive ion implantations are performed from a same photolithography mask M as described hereafter.

A resin layer is deposited above silicon layer 110 and this resin is insolated to keep, after development, resin over the entire surface of the silicon layer except in an area located above exposed area Z2. In the case where the used resin is a positive resin, lithography mask M used to insolate the resin is shown at position "a" above the structure shown in FIG. 5A. An implantation of dopant elements of a first type, for example, type P, is then performed to form a doped area 122 above exposed area Z2. In this example, the thickness of doped area 122 is substantially identical to that of insulating portion 104.

A second implantation is then performed. For this purpose, lithography mask M is shifted, leftwards in this example, so that the opening of mask M is shifted towards insulating portion 104, the mask being at position "b". A new resin layer is deposited and insolated according to mask M, then developed. Dopant elements of a second type, for example, type N, are then implanted, to form a doped area 123 substantially above doped area 122 but shifted leftwards above the right-hand portion of insulating portion 104. The resin layer is then eliminated.

Then, a third implantation is performed by depositing a new resin layer. Lithography mask M is shifted leftwards again to position "c", after which the resin is insolated and developed. Dopant elements of the first type, for example, type P in this example, are then implanted to obtain a doped area 124 placed substantially above doped area 123 in the upper portion of silicon layer 110. Three doped areas 122, 123, and 124 placed stepwise between silicon-germanium layer 103 and the surface of silicon layer 110 are thus obtained.

As a guide, doped areas 122 and 124 have a 40-nanometer thickness and doped area 123 has a 300-nanometer thickness. The sum of the thickness of areas 122, 123, and 124, that is, 380 nanometers, is equal to the thickness of silicon layer 110. The mask shift between each of the implantations approximately ranges from 200 to 250 nanometers.

One or several electrode areas are then formed. In this example, a single electrode 120 is formed above exposed area Z1. Electrode 121 has been replaced with doped areas 122, 123, and 124.

Figure 5B:
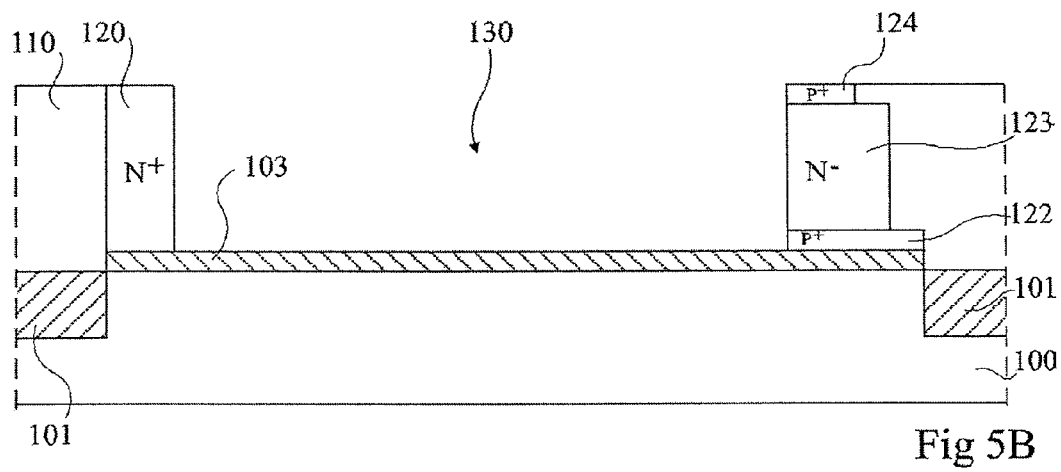

As illustrated in FIG. 5B, at the end of the step of forming of opening 130, areas 123 and 124 have been partially etched so that the three doped areas 122, 123, and 124 are level with the opening.

Figure 5C:
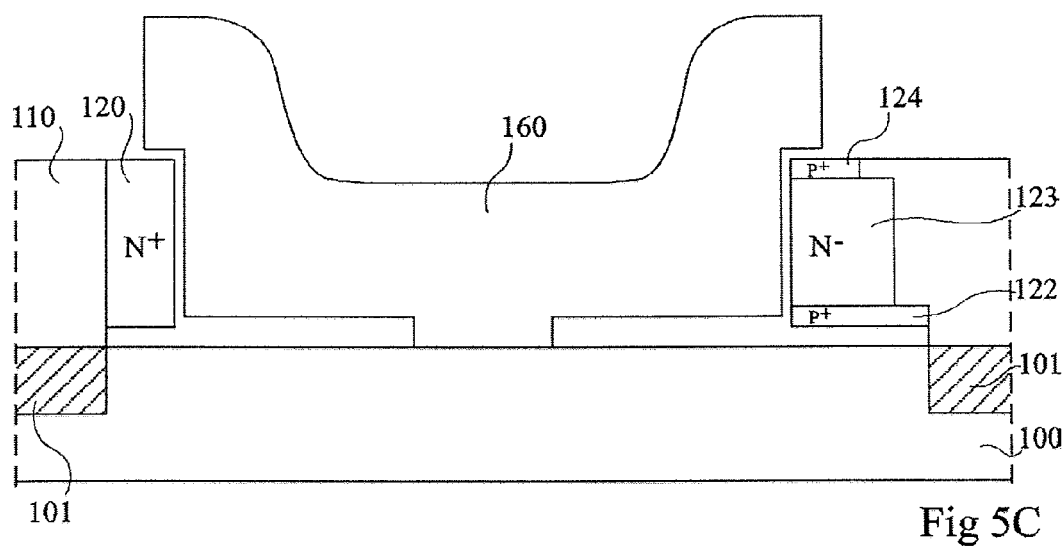

As illustrated in FIG. 5C, the finally-obtained microresonator comprises a vertical MOS transistor placed opposite to resonant element 160. Doped areas 122 and 124 form source/drain areas. Doped area 123 forms a "substrate" area. Resonant element 160 forms the transistor gate.

When resonant element 160 comes closer or moves away from area 123 of the substrate, the gate capacitance of the transistor varies. When the gate and the source/drain areas of the transistor are biased to turn on the transistor, a variation in the gate capacitance translates as a variation in the current flowing through the transistor. The transistor thus enables detecting the motions of the resonant element, especially when it starts resonating.

Of course, the present invention is likely to have various alterations, modifications, and improvements which will readily occur to those skilled in the art. In particular, it may be provided to form several electrode areas around the resonant element. All the electrode areas may be used to activate the resonant element, but it may be provided to use some of these areas to detect the motions of the resonant element.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A microresonator comprising a resonant element and at least one activation electrode placed close to the resonant element, in which the resonant element is placed in an opening of a semiconductor layer covering a substrate, the activation electrode being formed in the semiconductor layer and facing said opening, wherein the resonant element is made of single-crystal silicon.

2. The microresonator of claim 1, wherein the resonant element has the shape of a mushroom having a foot attached to the substrate.

3. The microresonator of claim 1, further comprising a vertical detection transistor comprising a stack of three doped semiconductor areas formed in the semiconductor layer and facing said opening, the lower and upper doped semiconductor areas forming source and drain areas of a first doping type, the intermediary semiconductor area forming a "substrate" area of a second doping type, the resonant element forming the transistor gate.

4. A microresonator comprising:
a substrate;
a semiconductor layer on the substrate, the semiconductor layer having an opening;
a single-crystal resonant element formed in the opening, the resonant element having a portion attached to the substrate; and
at least one activation electrode spaced from the resonant element.

5. A microresonator as defined in claim 4, wherein the at least one activation electrode comprises first and second activation electrodes located on opposite sides of the resonant element.

6. A microresonator as defined in claim 5, wherein the first and second activation electrodes are formed in the semiconductor layer.

7. A microresonator as defined in claim 4, wherein the resonant element covers the opening in the semiconductor layer.

8. A microresonator as defined in claim 4, wherein the resonant element includes an upper portion in spaced relation to the at least one activation electrode and a lower portion, smaller than the upper portion, attached to the substrate.

9. A microresonator as defined in claim 4, wherein the spacing between the at least one activation electrode and the resonant element is a few tens of nanometers.

10. A microresonator as defined in claim 4, wherein the at least one activation electrode comprises a heavily-doped area of the semiconductor layer.

11. A microresonator as defined in claim 4, wherein the at least one activation electrode is located in a wall of the opening in the semiconductor layer.

12. A microresonator as defined in claim 4, further comprising a vertical detection transistor including upper, intermediate and lower doped semiconductor areas formed in the semiconductor layer and facing the opening in the semiconductor layer, the upper and lower doped semiconductor areas forming source and drain areas of a first doping type, the intermediate doped semiconductor area having a second doping type, and the resonant element forming a transistor gate.

13. A microresonator as defined in claim 4, wherein the single-crystal resonant element comprises single-crystal silicon.

14. A microresonator as defined in claim 4, wherein the opening in the semiconductor layer comprises a circular opening.

15. A microresonator as defined in claim 4, wherein the opening in the semiconductor layer comprises a rectangular opening.

* * * * *

UNITED STATES PATENT AND TRADEMARK OFFICE
CERTIFICATE OF CORRECTION

PATENT NO. : 8,159,109 B2  
APPLICATION NO. : 12/850126  
DATED : April 17, 2012  
INVENTOR(S) : Nicolas Abelé et al.

Page 1 of 1

It is certified that error appears in the above-identified patent and that said Letters Patent is hereby corrected as shown below:

On the title page, in item (60), line 4 should read:
application No. PCT/FR2006/050078 on Jan. 31, Signed and Sealed this
Nineteenth Day of June, 2012

David J. Kappos
*Director of the United States Patent and Trademark Office*